(12) United States Patent
Orlov et al.

(10) Patent No.: US 11,183,716 B2
(45) Date of Patent: Nov. 23, 2021

(54) HEAT FLUX SENSORS FOR THERMALLY MONITORING LITHIUM-ION BATTERIES

(71) Applicant: Fluxion Technology Inc., Stony Brook, NY (US)

(72) Inventors: Alexander Orlov, Smithtown, NY (US); Parmeswaree Soobrayen, Ann Arbor, MI (US)

(73) Assignee: FLUXION TECHNOLOGY INC, Stony Brook, NY (US)

( * ) Notice: Subject to any disclaimer, the term of this patent is extended or adjusted under 35 U.S.C. 154(b) by 55 days.

(21) Appl. No.: 16/703,829

(22) Filed: Dec. 4, 2019

(65) Prior Publication Data

US 2020/0176831 A1    Jun. 4, 2020

Related U.S. Application Data

(60) Provisional application No. 62/775,091, filed on Dec. 4, 2018.

(51) Int. Cl.
| | | |
|---|---|---|
| H01M 10/48 | (2006.01) |
| H01M 10/0525 | (2010.01) |
| H01M 10/42 | (2006.01) |
| G01R 31/382 | (2019.01) |

(52) U.S. Cl.
CPC ........ *H01M 10/486* (2013.01); *G01R 31/382* (2019.01); *H01M 10/0525* (2013.01); *H01M 10/425* (2013.01)

(58) Field of Classification Search
None
See application file for complete search history.

(56) References Cited

U.S. PATENT DOCUMENTS

2019/0088912 A1* 3/2019 Goh ................... H01M 50/502

* cited by examiner

*Primary Examiner* — Jas A Sanghera

(57) ABSTRACT

A heat flux sensor device for measuring temperatures of a lithium-ion battery, comprising a flexible polymer substrate comprising a first side and a second side. A transducer is affixed to the first side. A first thermally conductive pad is thermally coupled to the transducer and affixed to the first side. A second TCP is thermally coupled to the transducer opposite to the first TCP and affixed to the first side. A plurality of conductive traces are electrically coupled to the transducer. A third TCP is affixed to the second side proximate to the second TCP. A fourth TCP is affixed to the second side opposite to the third TCP and proximate to the first TCP. The first TCP is thermally coupled to the fourth TCP via a first vertical interconnect access. The second TCP is thermally coupled to the third TCP via a second vertical interconnect access.

20 Claims, 13 Drawing Sheets

IBC Cylindrical Chamber - sized to accommodate 26mm diameter, aluminium spacers can be used for to reduce diameters to 21mm or 18mm for 26650, 21700 and 18650 cells.

Loading of 21700 cell to IBC chamber using aluminium spacer

HEAT FLUX SENSORS FOR THERMALLY MONITORING LITHIUM-ION BATTERIES

CROSS-REFERENCE TO RELATED APPLICATIONS

This application claims priority to U.S. Provisional Application No. 62/775,091 filed Dec. 4, 2019, which is hereby incorporated herein by reference.

FIELD OF THE INVENTION

The present disclosure relates generally to heat flux sensors. More specifically, the present disclosure describes heat flux sensors for thermally monitoring lithium-ion batteries.

BACKGROUND OF THE INVENTION

Though lithium-ion batteries are generally considered safe, heat related failures in applications such as automotive and energy grid power storage batteries can have disastrous consequences. Whereas lithium-ion batteries occupy a significant portion of the market, similar issues are also experienced by other non-rechargeable and chargeable batteries. Battery manufacturers typically try to improve reliability by adding the following three layers of protection: limiting the amount of active material to achieve a workable equilibrium of energy density and safety; inclusion of various safety mechanisms within the cell; and the addition of an electronic protection circuit in the battery pack. Safety protection from overheating is a critical component of every lithium-ion battery pack. While it is true that Underwriters Laboratories ("UL") have very specific regulations concerning the safety of lithium-ion battery packs there is no substitute to using sensors and deploying electronics and other physical protections to assure safe operation.

The primary safety circuits typically manage all the basic safety functions: over-voltage, under-voltage, over-current and sometimes over and under surface temperature. Protection circuits are typically contained in the Protection Circuit Module (PCM). The PCM is a part of the battery management system (BMS) that manages the electronics of a rechargeable battery pack by monitoring its state, reporting data, cells balancing y, and controlling its environment (such as cooling). Battery protection circuits for the most demanding applications are operated mostly by Integrated Circuits (ICs) typically using MOSFETs to switch lithium cells in and out of circuit. To be effective, PCM input parameters have to be both accurate and precise so that it may ensure the reliability of the system in the field.

BRIEF DESCRIPTION OF THE DRAWINGS

Some of the embodiments will be described in detail, with reference to the following figures, wherein like designations denote like members, wherein.

Figure 1:
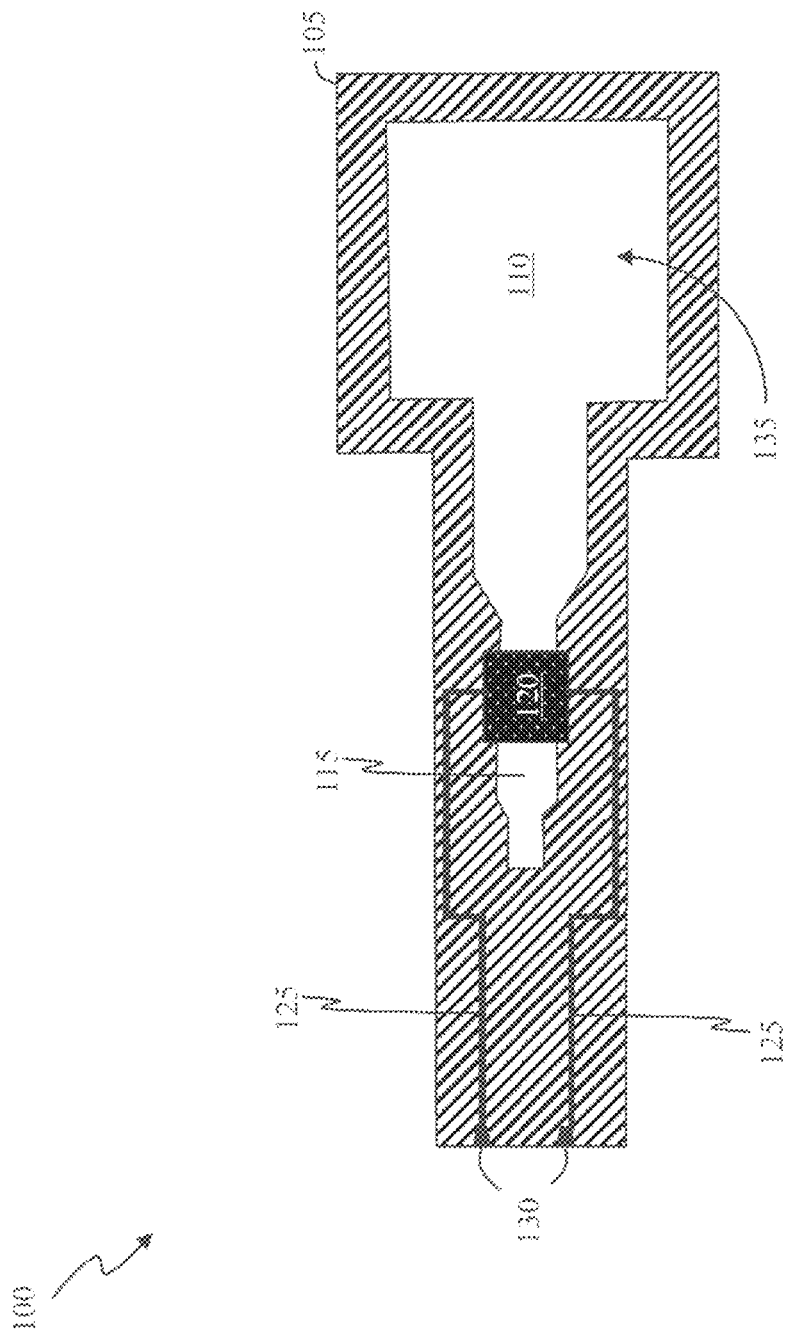
FIG. 1 depicts a top view of a first side of a heat flux sensor ("HFS") according to some embodiments.

Unless otherwise specifically noted, articles depicted in the drawings are not necessarily drawn to scale.

DETAIL DESCRIPTIONS OF THE INVENTION

As a preliminary matter, it will readily be understood by one having ordinary skill in the relevant art that the present disclosure has broad utility and application. As should be understood, any embodiment may incorporate only one or a plurality of the below-disclosed aspects of the disclosure and may further incorporate only one or a plurality of the below-disclosed features. Furthermore, any embodiment discussed and identified as being "preferred" is considered to be part of a best mode contemplated for carrying out the embodiments of the present disclosure. Other embodiments also may be discussed for additional illustrative purposes in providing a full and enabling disclosure. Moreover, many embodiments, such as adaptations, variations, modifications, and equivalent arrangements, will be implicitly disclosed by the embodiments described herein and fall within the scope of the present disclosure.

Accordingly, while embodiments are described herein in detail in relation to one or more embodiments, it is to be understood that this disclosure is illustrative and exemplary of the present disclosure and are made merely for the purposes of providing a full and enabling disclosure. The detailed disclosure herein of one or more embodiments is not intended, nor is to be construed, to limit the scope of patent protection afforded in any claim of a patent issuing here from, which scope is to be defined by the claims and the equivalents thereof. It is not intended that the scope of patent protection be defined by reading into any claim a limitation found herein that does not explicitly appear in the claim itself.

Thus, for example, any sequencet(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present disclosure. Accordingly, it is intended that the scope of patent protection is to be defined by the issued claim(s) rather than the description set forth herein.

Additionally, it is important to note that each term used herein refers to that which an ordinary artisan would understand such term to mean based on the contextual use of such term herein. To the extent that the meaning of a term used herein—as understood by the ordinary artisan based on the contextual use of such term—differs in any way from any particular dictionary definition of such term, it is intended that the meaning of the term as understood by the ordinary artisan should prevail.

Furthermore, it is important to note that, as used herein, "a" and "an" each generally denotes "at least one," but does not exclude a plurality unless the contextual use dictates otherwise. When used herein to join a list of items, "or" denotes "at least one of the items," but does not exclude a plurality of items of the list. Finally, when used herein to join a list of items, "and" denotes "all of the items of the list."

The following detailed description refers to the accompanying drawings. Wherever possible, the same reference numbers are used in the drawings and the following description to refer to the same or similar elements. While many embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims. The present disclosure contains headers. It should be understood that these headers are used as references and are not to be construed as limiting upon the subjected matter disclosed under the header.

Other technical advantages may become readily apparent to one of ordinary skill in the art after review of the following figures and description. It should be understood at the outset that, although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described below.

Unless otherwise indicated, the drawings are intended to be read together with the specification and are to be considered a portion of the entire written description of this invention. As used in the following description, the terms "horizontal", "vertical", "left", "right", "up", "down" and the like, as well as adjectival and adverbial derivatives thereof (e.g., "horizontally", "rightwardly", "upwardly", "radially", etc.), simply refer to the orientation of the illustrated structure as the particular drawing figure faces the reader. Similarly, the terms "inwardly," "outwardly" and "radially" generally refer to the orientation of a surface relative to its axis of elongation, or axis of rotation, as appropriate.

The present disclosure includes many aspects and features. Moreover, while many aspects and features relate to, and are described in the context of HFS for thermally monitoring Li-ion batteries, embodiments of the present disclosure are not limited to use only in this context.

Though lithium-ion batteries are generally considered safe, heat related failures in applications such as automotive and energy grid power storage batteries can have disastrous consequences. Battery manufacturers typically try to improve reliability by adding the following three layers of protection: limiting the amount of active material to achieve a workable equilibrium of energy density and safety; inclusion of various safety mechanisms within the cell; and the addition of an electronic protection circuit in the battery pack. Safety protection from overheating is a critical component of every lithium-ion battery pack. While it is true that Underwriters Laboratories ("UL") have very specific regulations concerning the safety of lithium-ion battery packs there is no substitute to using sensors and deploying electronics and other physical protections to assure safe operation.

The primary safety circuits typically manage all the basic safety functions: over-voltage, under-voltage, over-current and sometimes over and under surface temperature. Protection circuits are typically contained in the Protection Circuit Module (PCM). The PCM is a part of the battery management system (BMS) that manages the electronics of a rechargeable battery pack by monitoring its state, reporting data, cells balancing y, and controlling its environment (such as cooling). Battery protection circuits for the most demanding applications are operated mostly by Integrated Circuits (ICs) typically using MOSFETs to switch lithium cells in and out of circuit. To be effective, PCM input parameters have to be both accurate and precise so that it may ensure the reliability of the syatem in the field.

Some aspects of the instant disclosure add a layer of safety to the Li-ion battery by endowing it with sensors placed in close proximity to the electrodes where most of the chemical reactions take place.

Current Heat Flux Sensors use the Seebeck effect by creating a system consisting of two separated spatially and thermally but electrically connected tin series) junction groups. Heat flux sensors currently available on the market are of the bulk type. The sensors are typically made of either bulk semiconductors, including but not limited to, doped Bismuth, or metallic thermocouples connected in series. These sensors are at least a few mm thick and can still be used in this current invention but their topologies restrict them to few applications in battery packs. Heat flux sensors allow one to obtain a direct reading of the thermal transfers between a surface and its environment in a real-time manner. The balance of exchanged heat (received or supplied) that can be conductive, convective and radiative is expressed by means of the measured thermal flux ($W \cdot m^{-2}$).

The design requirements of the flux sensor are a very low thickness associated with a good thermal conductivity to be representative of the exchange between the surface on which the sensor is placed and its ambient environment. To fulfill these batteries requirements and to envisage large-scale development, we developed sensors in CMOS technology on silicon wafers which thickness is typically lower than 300 µm. The sensor can be packaged using chip scale and consists of two thermal pads separated by a large thermal resistance (discussed further below). These thermal pads can be connected to hot and cold environment sustaining a thermal gradient and a heat flux density. The electrical output of the sensor is proportional to the heat flux, where the proportionality is the temperature dependent Seebeck constant Se.

Another advantage of the sensors presented herein lies in the simple relation between the thermal flux and the corresponding DC voltage measured by the thermopile of the heat flux sensor. These sensors can be connected in series and soldered to both flex and semi-flex PCBs which are currently used in LIB battery management systems. The sensors disclosed herein potentially have a broad range of applications: contactless temperature measurements, evaporation of latent heat analyses, and determination of dissipated thermal power. A heat flux sensor can measure the local heat flux density in one direction. The result is expressed in watts per square meter. The principle of thermal sensors presented herein have a distinct fundamental difference from other thermal and photonic radiation sensors (e.g. photoconductors or photodiodes or solar cells) based on quantum detection and which requires sunlight and thus are limited to daylight applications.

Advantages of the proposed solution are uncooled operation and broadband response over the infrared spectrum enabled by appropriate volume absorbers. Presently, flux meters are made as freestanding sensors in proprietary packages with geometries that neither lend themselves to integration into batteries nor onto PCB's used for battery diagnostics systems. Because the magnitude of their outputs is typically in the microvolts range the signals must be conditioned and amplified. This currently requires a wire harness and power-hungry electronics. Noise fluctuations have to be filtered, which in turn can potentially mask important information in the data signals. Sensors disclosed herein are based on novel n- and p-type semiconducting materials which have high Se coefficients. Moreover, its fabrication is compatible with mature Silicon based microelectronic fabrication techniques and areal density of junctions is significantly higher than present-day technology.

Miniaturization allows for packaging using surface mount technology. Thus, the sensor can be mounted onto a PCB with the proper thermal conduits and pads that can intimately contact with the battery surface while not electrically shorting them. The same PCB can house the signal conditioner/amplifier as well as low-power microprocessor signal processing. The ability to have an ASIC chipset for data processing will become compelling as demand for such a system increases. Another consequence of this design philosophy is the reduction of both size and power needed to run the real time diagnostics of the battery. In the future, multiple sensor output data can be streamed wirelessly to a master processor and analyzed via a Bayesian-based machine learning engine.

Another advantage is the ability of such a system to automatically compensate for temperature changes at various heat power densities, thus achieving high accuracy of, for example, +/−2% over the full scale. Here, it is possible to achieve Seebeck coefficient values between 5-20 uV/K. If improved further, this level of accuracy can be very desirable in time critical situations, for example, in EHV battery packs for automotive applications. Preliminary testing achieved a one (1) order of magnitude improvement in sensitivity, while developing a pathway to achieving a one (1) order decrease in size as compared to the existing sensors on the market. In addition, approximately a one (1) order of magnitude reduction in price will also likely be achievable by this technology, given that manufacturing steps are amenable to scale up.

Figure 2:
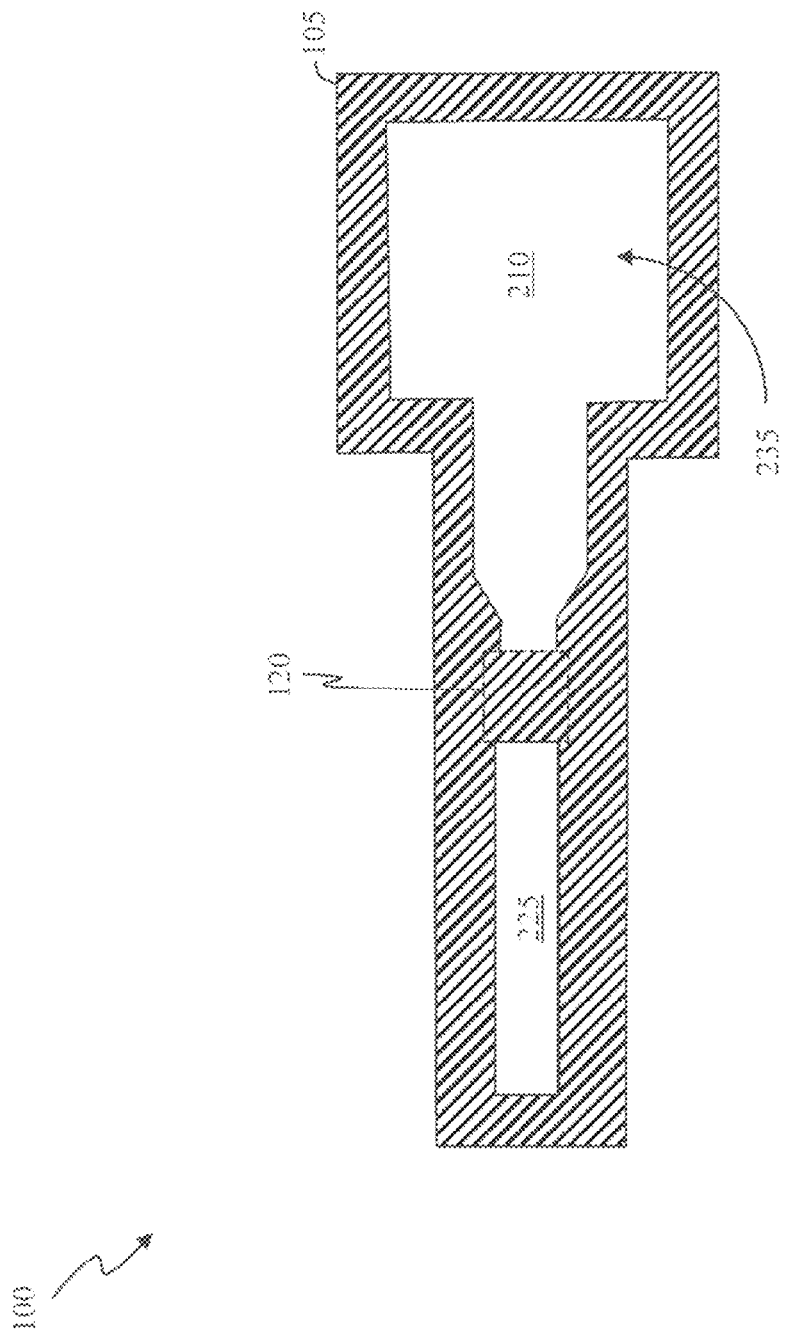
FIG. 2 depicts a bottom view of a second side of the HFS according to certain enibodiments.
Figure 3:
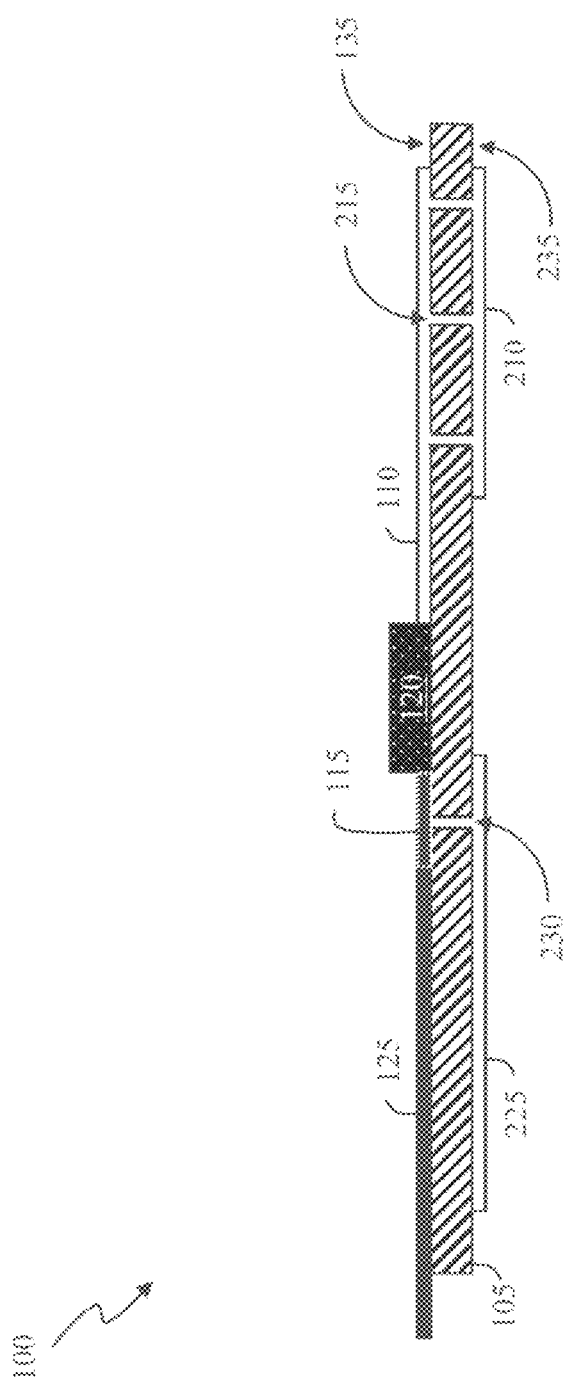
FIG. 3 depicts a side view of a planar state of the HFS according to other embodiments.

Referring now to FIGS. 1-3. Embodiments disclosed herein seek to provide a heat flux sensor ("HFS"), generally 100, for thermal monitoring of lithium-ion ("Li-ion") batteries. The HFS 100 is a device that converts thermal energy to electrical output according to some embodiments. In certain embodiments, the HFS 100 has an overall thickness of up to 300 µm. The HSF 100 preferably includes a flexible polymer substrate 105 that includes a first side 135 and a second side 235. For example, substrate 105 is typically a flexible polymer, such as a polyimide, polyetheretherketone (PEEK), a polyester, polyethylene terephthalate (PET), Kapton, or similar material. In certain embodiments, the substrate 105 is a layered material. The substrate 105 is flexible to allow the HFS 100 to contour to external structure of a battery module or battery cell. A transducer 120 is affixed to the first side 135. The transducer 120 is configured to convert thermal gradients to electrical output (discussed further below). The transducer 120 preferably includes doped silicon. In certain embodiments, the transducer 120 includes silicon doped with n-type and p-type dopants. The transducer 120 preferably includes n- and/or p-type semiconducting (e.g., silicon) materials which have a high Seebeck coefficient. Although various silicon dopants can be utilized, the transducer 120 preferably includes doped silicon, for example, silicon doped with phosphorus (n-type) and boron (p-type).

The HFS 100 utilizes thermal gradients to produce output voltage using thermally conductive pads ("TCP") that are thermally coupled to the Li-ion battery and its ambient environment. The TCPs are preferably substantially planar structures that conduct heat and include one or more metals. The TCPs are typically made of high thermally conductive materials and are securely bonded to the cell or module surface using thermal adhesives known in the art. Applicable metals for use in TCPs include, but are not limited to, copper, silver, aluminum, similar metals, or a corn of two or more thereo. However, the TCP's preferably include copper for its strength, hardness, flexibility, and heat conducting properties.

A first TCP 110 is preferably thermally coupled to the transducer 120 and affixed to the first side 135. The first TCP 110, the second TCP 115, the third TCP 225, and the TCP 210 are each thermally coupled to the transducer 120. A second TCP 115 is preferably affixed to the first side 135. The second TCP 115 is preferably positioned opposite to the first TCP 110. A third TCP 208 is preferably affixed to the second side 235 proximate to the second TCP 208. A fourth TCP 210 is affixed to the second side 235. The fourth TCP 210 is positioned opposite to the third TCP 225 and proximate to the first TCP 110. The first TCP 110 is preferably thermally coupled to the fourth TCP 210 via a first vertical interconnect access 215. Vertical interconnect accesses are electrical connections between layers in a physical electronic circuit that goes through the plane of one or more adjacent layers. The second TCP 115 is preferably thermally coupled to the third TCP 225 via a second vertical interconnect access 230. As reflected in FIG. 6, the third TCP 225 is positioned adjacent to a thermally coupled to a Li-ion battery 530. Not to be limited by theory, as the Lithium-ion battery 530 heats up, a thermal difference can exist between the Lithium-ion battery 530 and its ambient environment.

Figure 6:
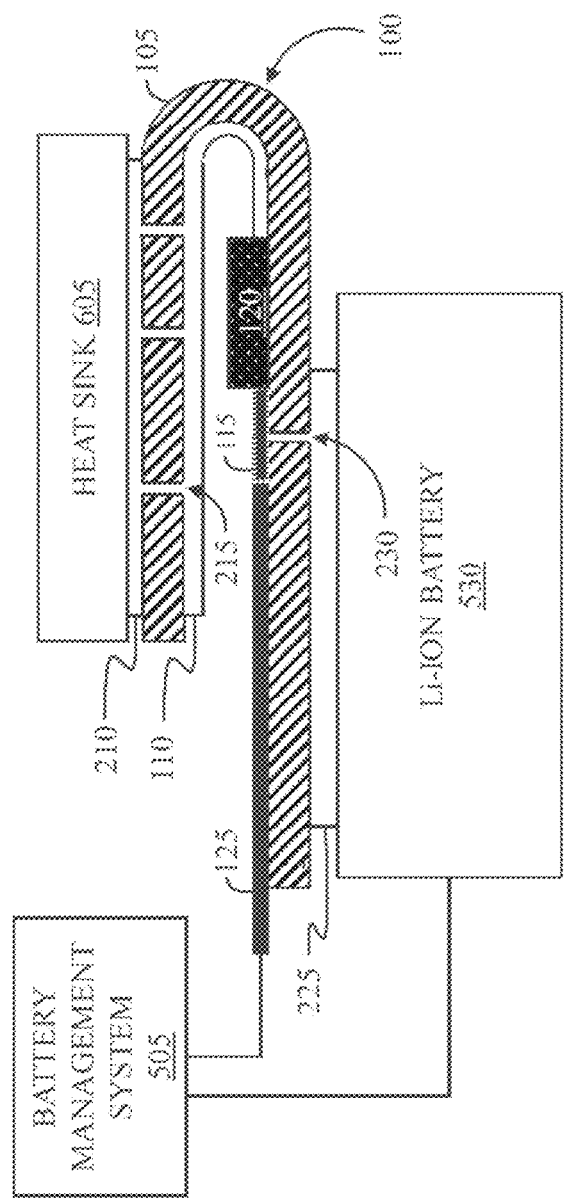
FIG. 6 depict a side view of the folded state of the HFS coupled to a battery management system, Lithium-ion battery, and a heat sink according to other embodiments.

To generate thermal gradients for use via the transducer 120, the first TCP 110 and the fourth TCP 210 are preferably configured to be thermally isolated from the Li-ion battery 530 and thermally coupled to a heat sink 605, as reflected in FIG. 6. As a result of the thermal isolation, thermal radiation received by the first TCP 110, the third TCP 225, and the fourth TCP 210 create a thermal gradient within the transducer 120. Although other metals can be utilized to form the TCPs, the first TCP 110, the second TCP 115, the third TCP 225, and the fourth TCP 210 preferably include copper. Although other structures can be utilized to promote thermal conduction, the first TCP 110, the second TCP 115, the third TCP 225, and the fourth TCP 210 are each preferably substantially planar, for example, to minimize the overall thickness of the HFS 100.

In some embodiments, a plurality of conductive traces 125 are electrically coupled to the transducer 120. For example, the plurality of conductive traces 125 are the equivalent of wires for conducting signals. The transducer 120 is a device that uses the Seebeck effect to generate an electrical signal proportional to the thermal flux (e.g., which can include radiative flux, conduction, and convection) flowing through it via the first TCP 110, the second TCP 115, the third TCP 225, and the fourth TCP 210. The transducer 120 converts the thermal gradient to electrical output. In accordance with certain embodiments, each conductive trace 125 consists of a substantially planar and narrow copper structure. In other embodiments, the plurality of conductive traces 125 include, for example, silver, gold, aluminum, brass, steel, bronze, similar metals, or combinations of two or more thereof. The transducer 120 is configured to transmit the electrical output via the plurality of conductive traces 125.

Figure 5:
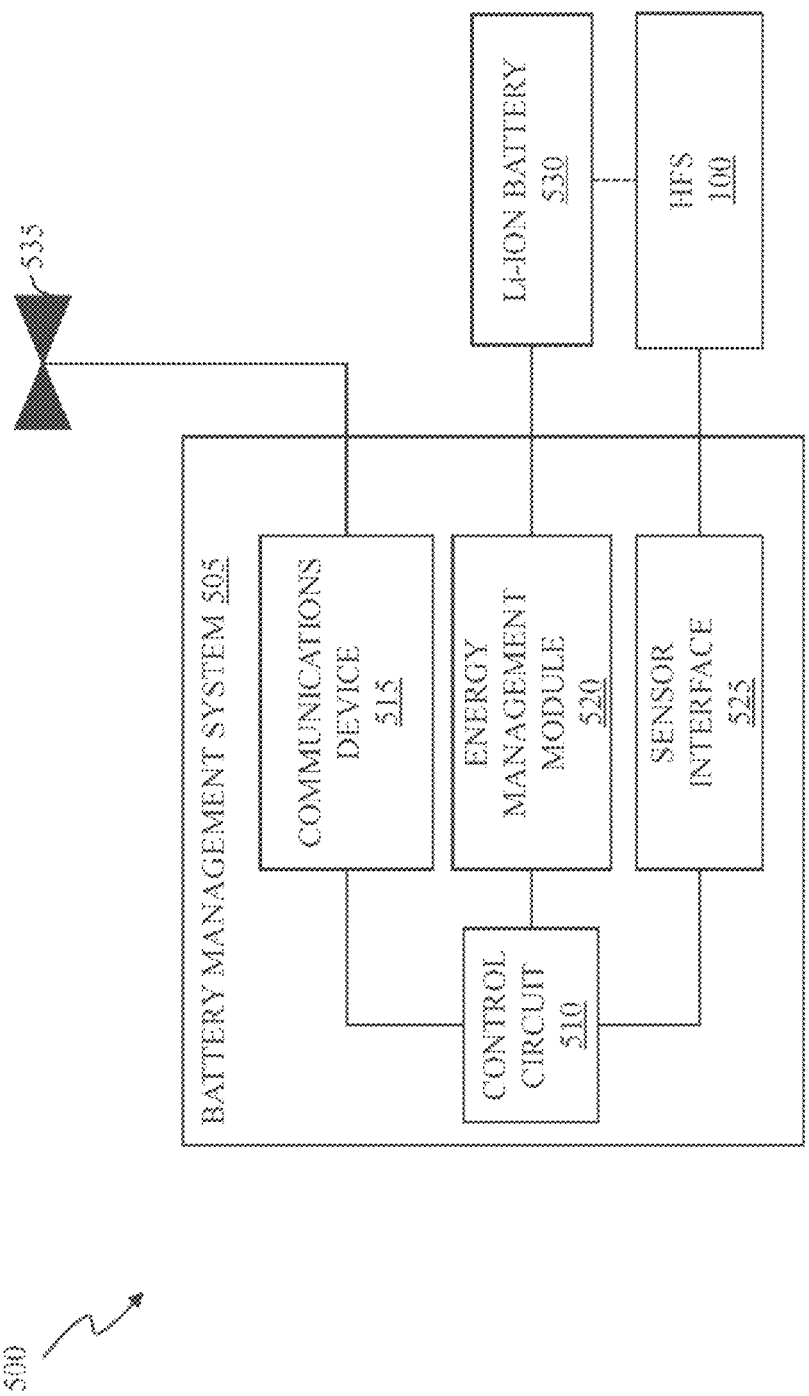
FIG. 5 illustrates a block diagram of an environment for thermally monitoring Lithium-ion batteries using the HFS of FIG. 1 according to some embodiments.

The following description is further supported by FIGS. 5-6. The transducer 120 is preferably configured to transmit the electrical output via the plurality of conductive traces 125. In certain embodiments, the HFS 100 is configured to be positioned external to (e.g., on an external surface) the Li-ion battery 530. In other embodiments, HFS 100 is configured to be positioned within the Li-ion battery 530, for example, affixed to the battery module or cell. It is preferred that the plurality of conductive traces 125 are electrically coupled to a battery management system 505.

Not to be limited by theory, safety protection from overheating is a critical component of every Li-ion battery pack. Although specific regulations govern the safety of Li-ion battery packs, there are no substitutes to using sensors, electronics, and other physical protections to assure safe operation thereof. For example, the primary safety circuits typically manage all basic safety functions: over-voltage, under-voltage, over-current and sometimes over and under surface temperature. Primary safety circuits are typically included in the protection circuit module (PCM). The PCM is a part of the battery management system (e.g., the battery management system 405), which manages the electronics of a rechargeable battery pack (e.g., the Li-ion battery 530) by, for example, monitoring its state, reporting that data, balancing the cells along with protecting the battery, and controlling its environment (such as cooling).

Referring now to FIG. 5. The battery management system 505 includes one or more communications devices 515, energy management modules 520, and sensor interfaces 525 all interconnected to one or more control circuits 510. Li-ion battery 530 is electrically coupled to the energy management module 520. Li-ion battery 530 can be rechargeable or non-chargeable. The battery management system 505 can be activated based on sensors from other systems coupled thereto. In some embodiments, the battery management system 505 includes a an array of the HFS 100 affixed to one or more of the Li-ion battery 530. The HFS 100 is electrically coupled to the sensor interface 525 and thermally coupled to the Li-ion battery 530 as reflected in FIG. 6. To be sure, control circuit 510 can be configured to perform one or more of the tasks, steps, processes, functions disclosed herein, such as those of the energy management module 520 and/or the sensor interface 525. The communications device 515 is a device that can communicate (e.g., via antenna 535) with another computing device using radiofrequency (RF) waves. In other embodiments, the energy management module 520 is configured to determine, for example, the energy (kWh) delivered since last charge or charge cycle, charge (Ah) delivered or stored, and/or total energy delivered since first use, etc.

In yet still other embodiments, the control circuit 510 performs one or more functions of the energy management module 520 and/or the sensor interface 525. The sensor interface 525 is a device that reads the electrical outputs of the HFS 100 and amplifies the signal for processing by the control circuit 510 according to certain embodiments. The battery management system 505 is preferably electrically coupled to the Li-ion battery 530. In certain embodiments, the battery management system 505 is configured to utilize the electrical output of the HFS 100 to perform one or more tasks, including, but not limited to, monitoring state of charge, reporting that data, balancing the cells along with protecting the battery, and controlling its environment. Here, the battery management system 405 utilizes the electrical output from one or more copies of the sensors 100 to at least partially power itself.

Challenges such as poor capacity retention during cycling and large voltage hysteresis must be overcome. The core temperature of the cell is an important parameter of Li-ion battery thermal management. Current surface temperature measurements are typically taken using thermocouples, which are poor indicators of core Li-ion battery temperatures. Unfortunately, most battery management systems known in the art use surface temperature to determine core temperatures. Therefore, non-invasive methods for core temperature measurements are very desirable. While the surface temperature of a heat generating solid body can invasively be measured using a variety of methods, there are a scarcity of techniques that exist for non-invasively measuring the temperature inside the solid body.

Not to be limited by theory, internal temperature measurements are desirable as surface temperature measurements fail to yield indications of the internal temperature and hence the electrochemistry. The highest temperature, usually located at the core of the body, dictates system performance and safety. For example, Li-ion cells provide good energy storage and conversion characteristics, but unfortunately suffer from safety problems related to overheating due to insufficient heat removal during unforeseen operational events.

The battery management system 405 is preferably configured to determine the core temperature readings of Li-ion battery 530. The battery management system 405 is configured to determine, using the electrical output, an entropy (i.e. energy) value of the Li-ion battery 530, for example, using a conventional method known in the art. The battery management system 405 is configured to determine an enthalpy (i.e. heat) value of the Li-ion battery 530, for example using a conventional method known in the art. According to certain embodiments, determining the enthrdpy value (e.g., under steady state conditions) includes determining a core temperature value ($T_c$) of the Li-ion battery 530 according to EQ1:

$$T_c = \theta_{j-a} * P_c + T_a$$

Where $\theta_{j-a} = \theta_{c-s} \theta_{s-f} + \theta_{f-a}$; $\theta_{c-s} = T_c - T_s$; $\theta_{s-f} = T_s - T_f$; and $\theta_{f-a} = T_f - T_a$ [EQ1]

Here, $\theta_{c-s}$ is the thermal resistance of the Li-ion battery; $\theta_{s-f}$ is the thermal resistance of the device; $\theta_{f-a}$ is the thermal resistance of the heat sink; $P_c$ is the heat loss of the Li-ion battery due to one or more of a non-faradaic process and a faradic process; $T_a$ is the temperature of the air adjacent to the heat sink; $T_s$ is the surface temperature of the Li-ion battery 530; $T_f$ is the temperature of the heat sink 605; and $T_a$ is the temperature of the air. Hence, for example, $T_c$ represents the thermal resistance from the joint formed by heat sink 605 and the fourth TCP 210 to the ambient air.

In other embodiments, interpretation of the heat flow measured by the HFS 100 is based on the thermodynamics of a battery (e.g., the Li-ion battery 530). Turing now to EQ. 2, the first law of thermodynamics governs batteries where rate of changes in internal energy over time ($\Delta U/dt$) produce heat (Q) and electrical work (W) through electrochemical reactions, phase changes, and mixing processes.

$$\frac{\Delta U}{dt} = \frac{\Delta H_{tot}}{dt} = \dot{Q} - \dot{W} \quad [\text{EQ. 2}]$$

An ideal battery converts all chemical energy into electrical work but practical batteries have inherent heat losses. The change in internal energy ($\Delta U$) is equal to the change in enthalpy ($\Delta H_{tot}$) for a system with a constant volume, such as a sealed coin cell. Here, we use a generalized energy balance for batteries to show that $\Delta H_{tot}/d_t$ consists of contributions from enthalpies of reactions, enthalpies of mixing, phase changes, and heat capacity. In many thermal analyses of batteries, the enthalpy of mixing and enthalpy of phase change are considered negligible and the energy balance can be simplified to include only the enthalpy of reaction and heat capacity terms.

The maximum amount of work that a cell can produce is the reversible work, Which would occur if the cell was discharged at an infinitely small current. Reversible work can be estimated as the cell's open circuit potential ($E_{ocp}$) during discharge multiplied by the current (I). Entropic heat transfer can be determined from the change in $E_{ocp}$ with respect to time multiplied by the core temperature T of the cell and the current (EQ 3).

$$\dot{Q} = I(E_{load} - E_{ocp}) + I\left(T\frac{dE_{ocp}}{dT}\right) + \dot{Q}_p \quad [\text{EQ. 3}]$$

Here, $Q_p$, is the heat flow from side or parasitic reactions at the anode and/or cathode. This heat contribution is typically a result of solid electrolyte interphase ("SEI") formation or other parasitic reactions. For example, SEI is a passive layer formed on electrode surfaces from decomposition products of electrolytes.

Based on the above two equations, a heatlenthalpy tracking algorithm can he formed that allows the system to take remedial actions and predict and warn the user of impending battery failure modes. For example, a carefully designed model of the voltage-versus-temperature-versus-capacity characteristics of cell types to update the cell's chemical capacity during normal battery use.

Thus, the ability to measure additional capacity and heat flow allow one to correlate the thermal signatures to electrolyte reaction with associated SEI formation.

In some embodiments, the battery management system 405 determines heat flux and thereby generates a calculated value. The battery management system 405 determines the theoretical Gibbs free-energy value change of the Li-ion battery 405 and generates a notification when the calculated value is greater than the theoretical Gibbs free-energy value change, which potentially reflects that there are other processes generating heat in addition to lithiation of the electrode host.

Figure 4:
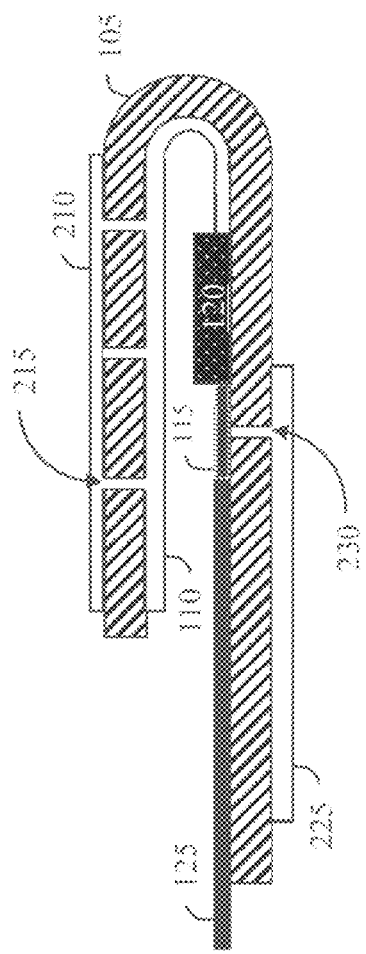
FIG. 4 depicts a side view of a folded state of the HFS according to yet still other embodiments.

The HFS 100 preferably includes a planar state (e.g., as reflect FIG. 3) and a folded state (e.g., as reflected in FIGS. 4 and 6). In the planar state, according to some embodiments, the first TCP 110 and the fourth TCP 210 are oriented co-planarly with the second TCP 115 and the third TCP 225. In the folded state, according to other embodiments, the first TCP 110 and the fourth TCP 210 are oriented angularly relative to the second TCP 115 and the third TCP 225. For example, the folded state facilitates the aforementioned thermal isolation of the first TCP 110 and the fourth TCP 210 relative.

Figure 7:
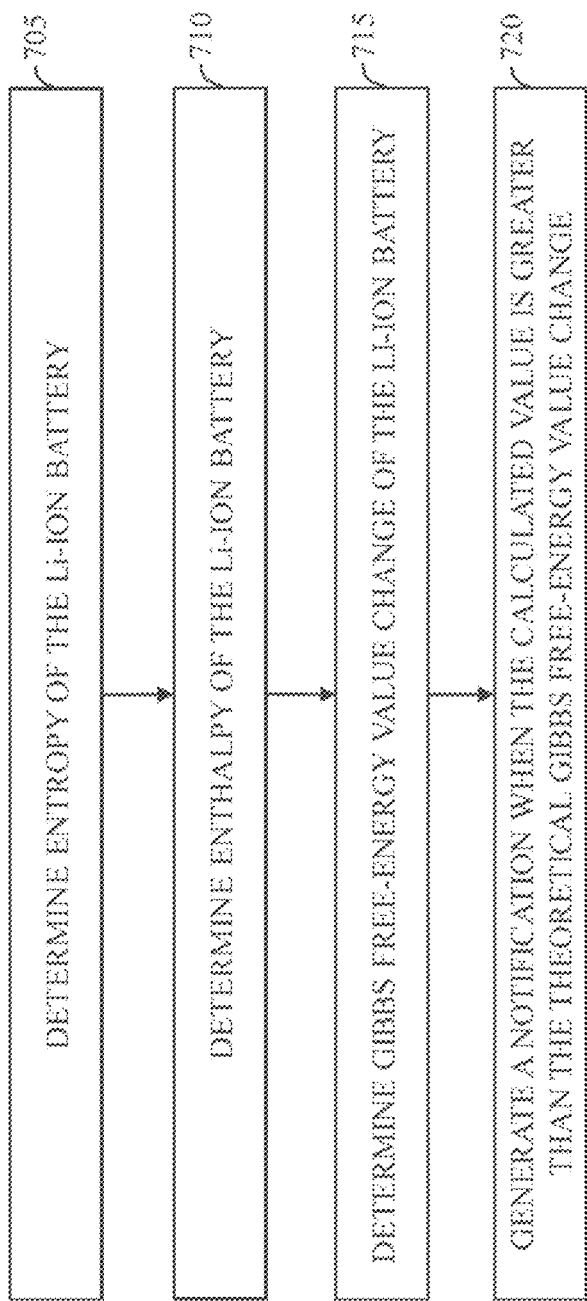
FIG. 7 illustrates a method for thermally monitoring Lithium-ion batteries utilizing the HFS of FIG. 1 according to some embodiments.

FIG. 7 illustrates a process for determining a state of charge of the Li-ion battery according to some embodiments. At step 705, the entropy of the Li-ion battery 530 is determined. At step 710, the enthalpy of the Li-ion battery 530 is determined, for example, as described above. At step 715, the Gibbs free-energy value of the Li-ion battery 530 (i.e. the calculated value). At step 720, a notification is generated when the calculated value is greater than the theoretical Gibbs free-energy value change.

Figure 8:
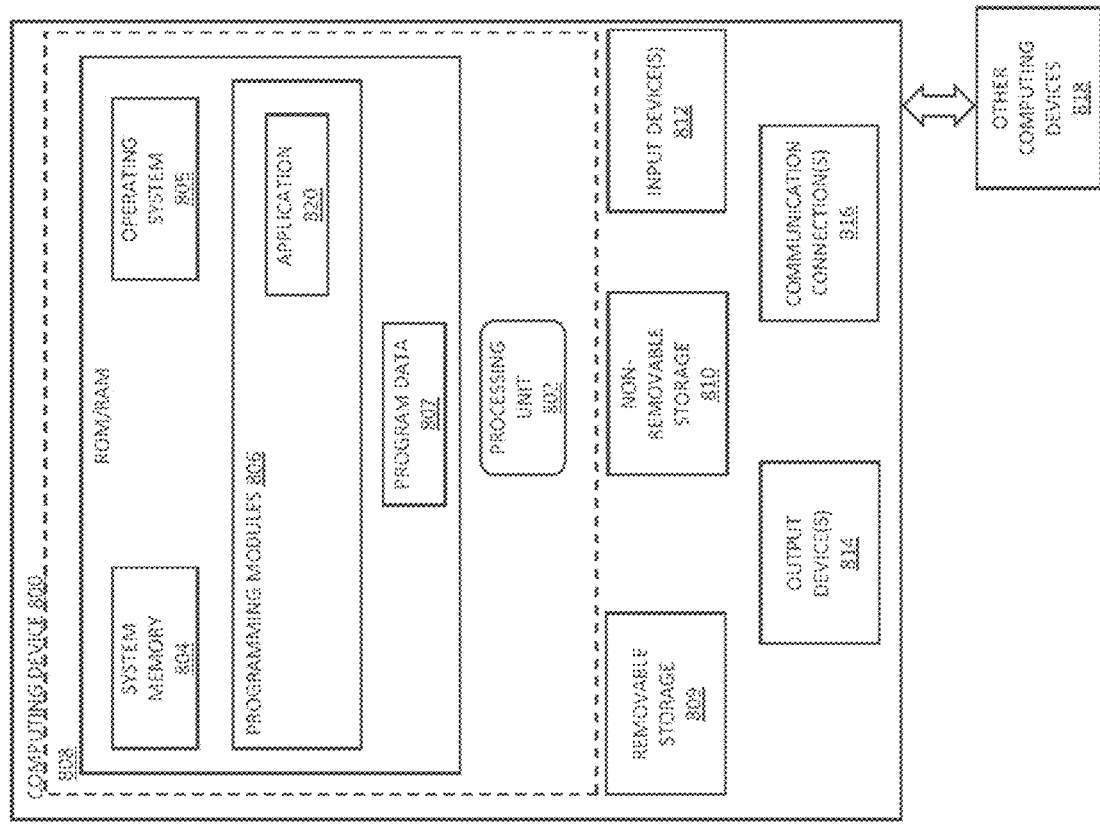
FIG. 8 depicts an exemplary system configuration according to certain embodiments.
Figure 9:
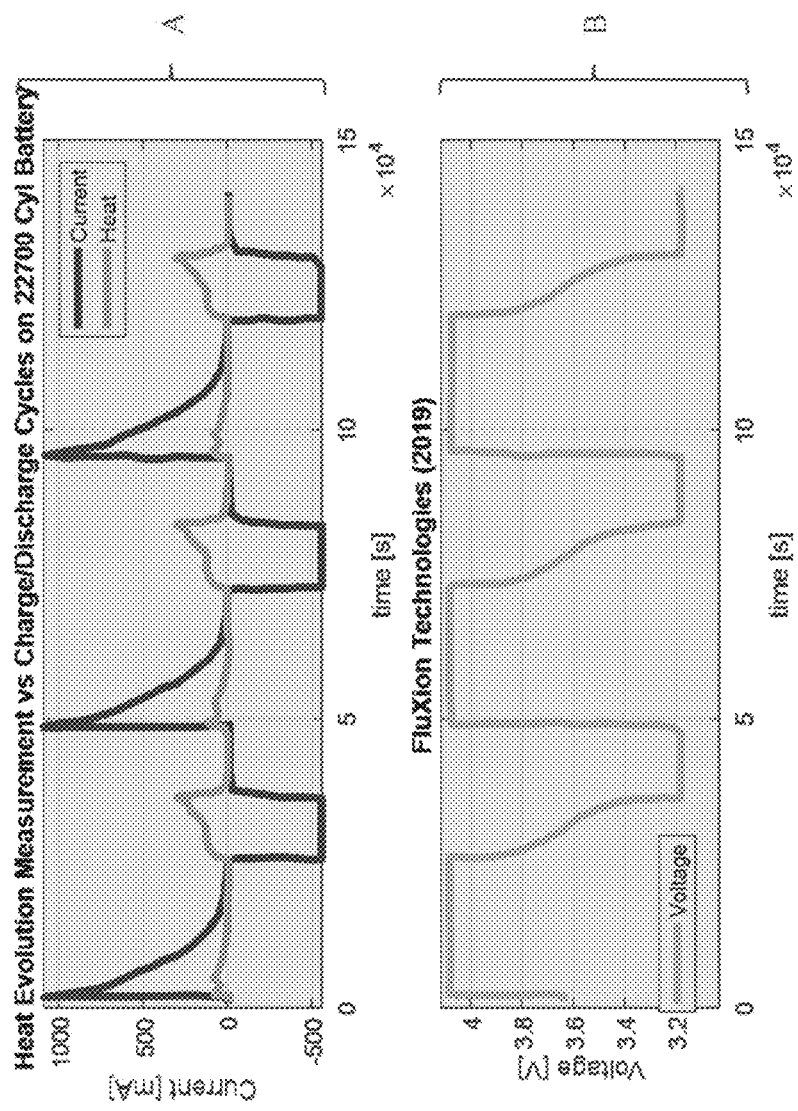
FIG. 9 depicts experimental results according to certain embodiments.
Figure 10:
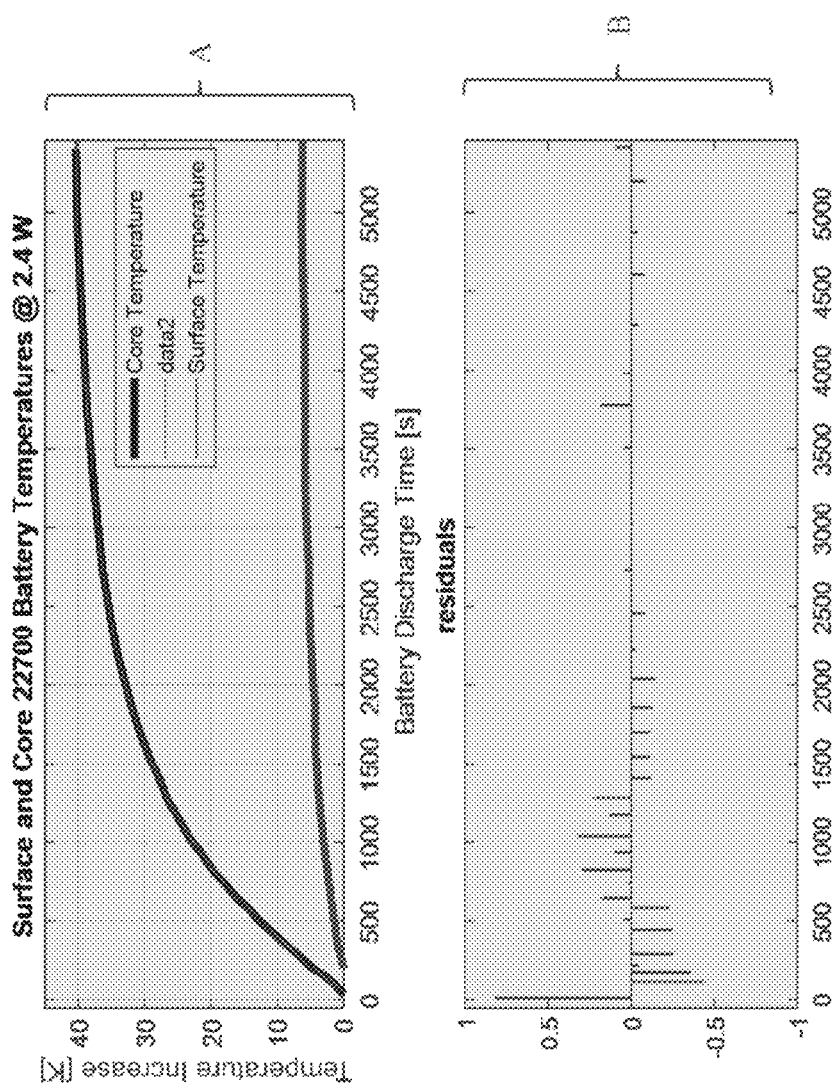
FIG. 10 depicts experimental results according to other embodiments.
Figure 11:
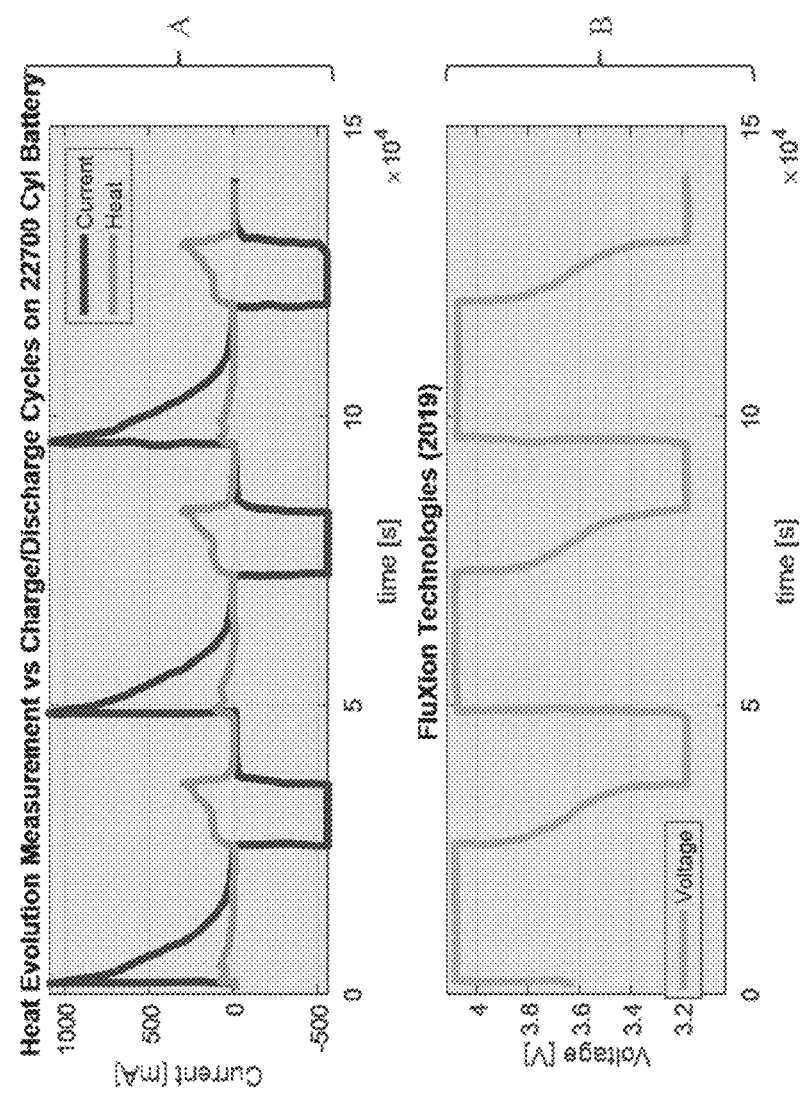
FIG. 11 depicts experimental results according to some embodiments.
Figure 12:
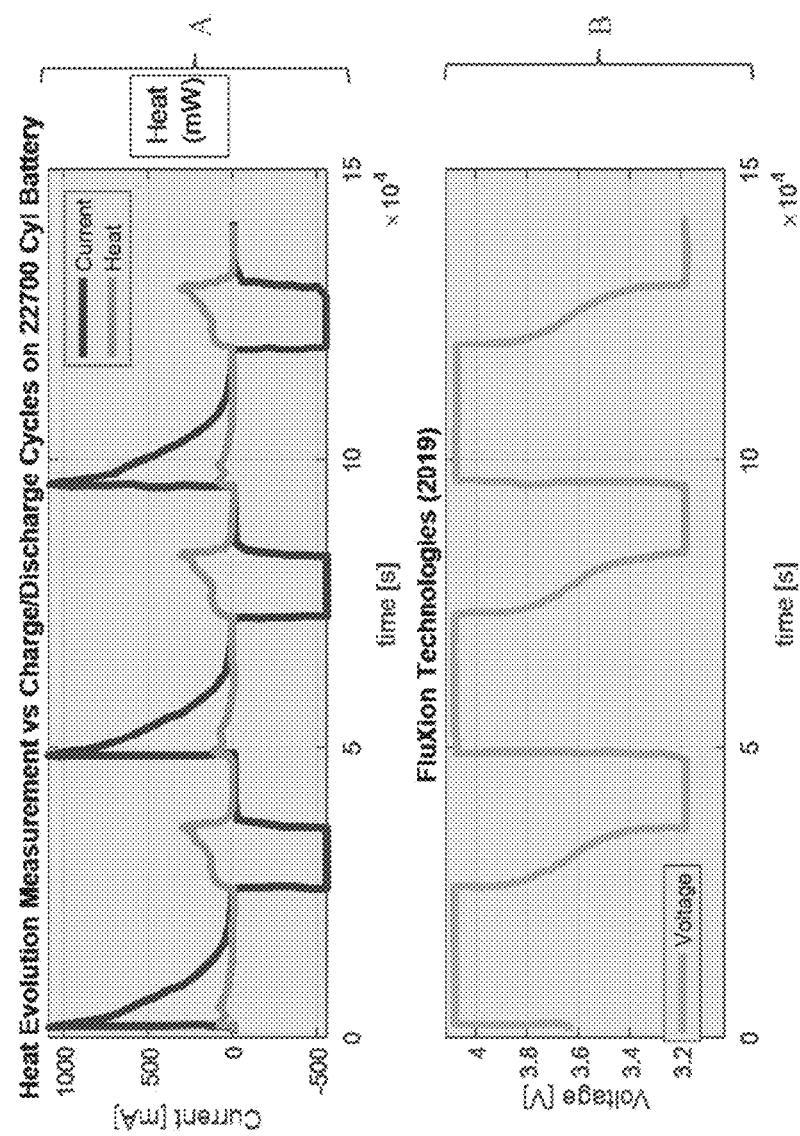
FIG. 12 depicts experimental results according to yet still other embodiments.
Figure 13:
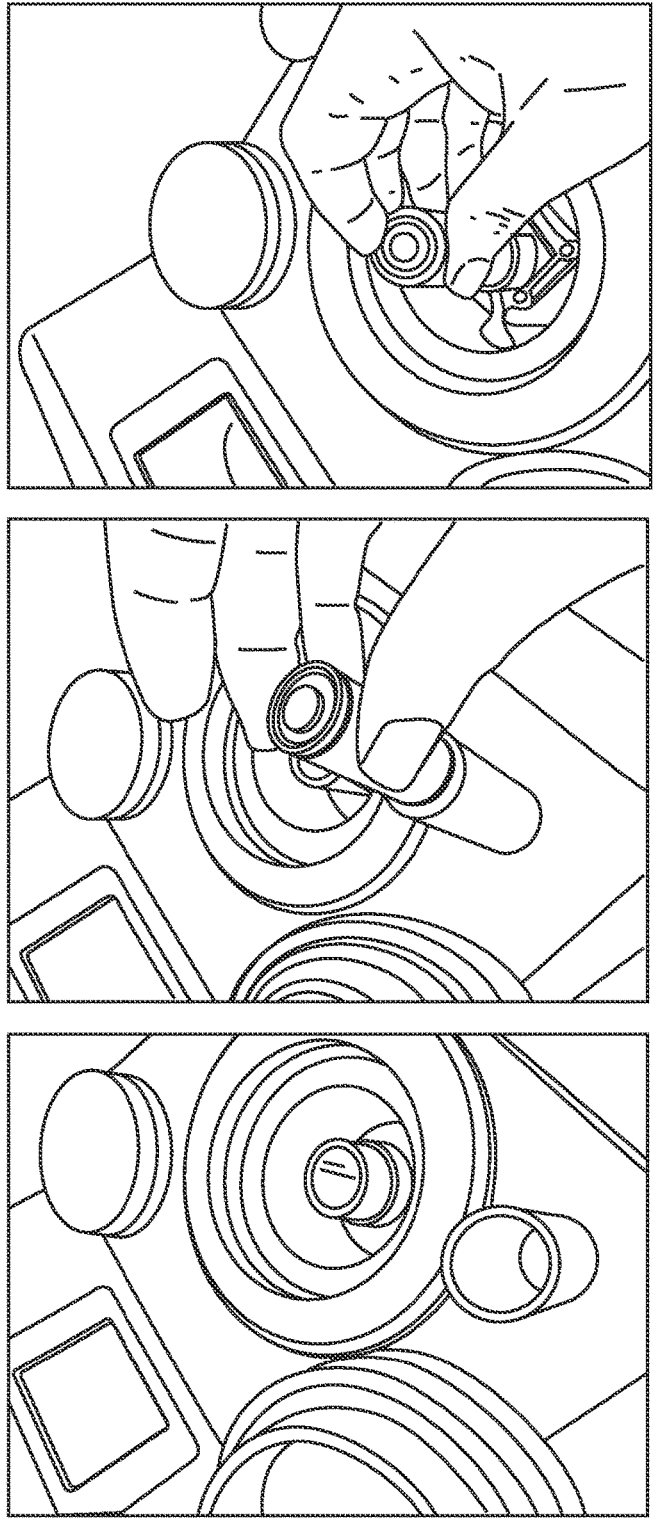
FIG. 13 depicts loading of a 22700 cell to an IBC chamber using aluminum spacer according to certain embodiments.

With reference to FIG. 8, a system consistent with an embodiment of the disclosure may include a computing device or cloud service, such as computing device 800. Computing device 800 can represent battery management system 805. In a basic configuration, computing device 800 may include at least one processing unit 802 (e.g., control circuit 510) and a system memory 804. Depending on the configuration and type of computing device, system memory 804 may comprise, but is not limited to, volatile (e.g. random-access memory (RAM)), non-volatile (e.g. read-only memory (ROM)), flash memory, or any combination. System memory 804 may include operating system 805, one or more programming modules 806, and may include a program data 807. Operating system 805, for example, may be suitable for controlling computing device 800's operation. In one embodiment, programming modules 806 may include machine learning module. Furthermore, embodiments of the disclosure may be practiced in conjunction with a graphics library, other operating systems, or any other application program and is not limited to any particular application or system. This basic configuration is illustrated in FIG. 8 by those components within a dashed line 808.

Computing device 800 may have additional features or functionality. For example, computing device 800 may also include additional data storage devices (removable and/or non-removable) such as, for example, magnetic disks, optical disks, or tape. Such additional storage is illustrated in FIG. 8 by a removable storage 809 and a non-removable storage 810. Computer storage media may include volatile and nonvolatile, removable and non-removable media implemented in any method or technology for storage of information, such as computer-readable instructions, data structures, program modules, or other data. System memory 804, removable storage 809, and non-removable storage 810 are all computer storage media examples (i.e., memory storage.) Computer storage media may include, but is not limited to, RAM, ROM, electrically erasable read-only memory (EEPROM), flash memory or other memory technology, CD-ROM, digital versatile disks (DVD) or other optical storage, magnetic cassettes, magnetic tape, magnetic disk storage or other magnetic storage devices, or any other medium which can be used to store information and which can be accessed by computing device 800. Any such computer storage media may be part of device 800. Computing device 800 may also have input device(s) 812 such as a keyboard, a mouse, a pen, a sound input device, a touch input device, a location sensor, a camera, a biometric sensor, etc. Output device(s) 814 such as a display, speakers, a printer, etc. may also be included. The aforementioned devices are examples and others may be used.

Computing device 800 may also contain a communication connection 816 that may allow device 800 to communicate with other computing devices 818, such as over a network in a distributed computing environment, for example, an intranet or the Internet. Communication connection 816 is one example of communication media. Communication media may typically be embodied by computer readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media. The term computer readable media as used herein may include both storage media and communication media.

As stated above, a number of program modules and data files may be stored in system memory 804, including operating system 805. While executing on processing unit 802 (e.g., control circuit 510), programming modules 806 (e.g., application 820 such as a media player) may perform processes including, for example, one or more stages of methods, algorithms, systems, applications, servers, databases as described above. The aforementioned process is an example, and processing unit 802 (e.g., control circuit 510) may perform other processes. Other programming modules that may be used in accordance with embodiments of the present disclosure may include machine learning application.

Generally, consistent with embodiments of the disclosure, program modules may include routines, programs, components, data structures, and other types of structures that may perform particular tasks or that may implement particular abstract data types. Moreover, embodiments of the disclosure may be practiced with other computer system configurations, including hand-held devices, general purpose graphics processor-based systems, multiprocessor systems, microprocessor-based or programmable consumer electronics, application specific integrated circuit based electronics, minicomputers, mainframe computers, and the like. Embodiments of the disclosure may also be practiced in distributed computing environments where tasks are performed by remote processing devices that are linked through a communications network. In a distributed computing environment, program modules may be located in both local and remote memory storage devices.

Furthermore, embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including but not limited to mechanical, optical, fluidic, and quantum technologies. In addition, embodiments of the disclosure may be practiced within a general-purpose computer or in any other circuits or systems.

Embodiments of the disclosure, for example, may be implemented as a computer process (method), a computing system, or as an article of manufacture, such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present disclosure may be embodied in hardware and/or in software (including firmware, resident software, micro-code, etc.). In other words, embodiments of the present disclosure may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random-access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While certain embodiments of the disclosure have been described, other embodiments may exist. Furthermore, although embodiments of the present disclosure have been described as being associated with data stored in memory and other storage mediums, data can also be stored on or read from other types of computer-readable media, such as secondary storage devices, like hard disks, solid state storage (e.g., USB drive), or a CD-ROM, a carrier wave from the Internet, or other forms of RAM or ROM. Further, the disclosed methods' stages may be modified in any manner, including by reordering stages and/or inserting or deleting stages, without departing from the disclosure.

FIGS. 9-13 depicts experimental results of measurements of heat evolved for charge-discharge cycle of 22700 cylindrical battery under charge/discharge conditions. The results represent measured current, voltage, surface temperature, core temperature and heat curves as measured using the HFS 100 and represent the voltage output from the Si-doped thermal flux sensor disclosed herein (i.e. the HGFS 100).

Although the disclosure has been explained in relation to its preferred embodiment, it is to be understood that many other possible modifications and variations can be made without departing from the spirit and scope of the disclosure.

The invention claimed is:

1. A heat flux sensor device for measuring temperatures of a lithium-ion battery, comprising:
a flexible polymer substrate comprising a first side and a second side;
a transducer affixed to the first side;
a first thermally conductive pad ("TCP") thermally coupled to the transducer and affixed to the first side;
a second TCP thermally coupled to the transducer opposite to the first TCP and affixed to the first side;
a plurality of conductive traces electrically coupled to the transducer;
a third TCP affixed to the second side proximate to the second TCP;
a fourth TCP affixed to the second side opposite to the third TCP and proximate to the first TCP;
wherein
the first TCF is thennally coupled to the fourth TCP via a first vertical interconnect access;
the second TCP is thermally coupled to the third TCP via a second vertical interconnect access;
the third TCP is configured to be thermally coupled to a Li-ion battery module;
the first TCP and the fourth TCP are both thermally isolated from the Li-ion battery and thermally coupled to a heat sink;
the first TCP, the third TCP, and the fourth TCP are configured to create a thermal gradient within the transducer;
the transducer is configured to convert the thermal gradient to electrical output using the Seebeck effect;
the transducer is configured to transmit the electrical output via the plurality of conductive traces;
the device is configured to be positioned external to the Li-ion battery module; and
the transducer comprises Si-doped material.

2. The device of claim 1, wherein
the plurality of conductive traces are electrically coupled to a battery management system;
the battery management system is electrically coupled to the Li-ion battery; and
the battery management system configured to utilize the electrical output to at least partially power itself.

3. The device of claim 2, wherein the first TCP, the second TCP, the third TCP, and the fourth TCP comprise copper.

4. The device of claim 3; wherein the battery management system is configured to determine, using the electrical output, an entropy value of the Li-ion battery.

5. The device of claim 4, wherein the first TCP, the second TCP, the third TCP, and the fourth TCP are each substantially planar.

6. The device of claim 5, wherein the battery management system is configured to:
determine an enthalpy value of the Li-ion battery,
determine a difference between the entropy value and the enthalpy value and thereby generate a calculated value;
determine a theoretical Gibbs free-energy value change of the Li-ion battery;
generate a notification when the calculated value is greater than the theoretical Gibbs free-energy value change.

7. The device of claim 6, wherein the device comprises an overall thickness of up to 300 μm.

8. The device of claim 7, wherein
the device comprises a planar state and a folded state;
in the planar state, the first TCP and the fourth TCP are oriented co-planarly with the second TCP and the third TCP;
in the folded state, the first TCP and the fourth TCP are oriented angularly with the second TCP and the third TCP.

9. The device of claim 8, wherein the flexible polymer substrate comprises polyimide, polyetheretherketone, a polyester, polyethylene terephthalate, and Kapton.

10. The device of claim 9, wherein the Si-doped material comprises silicon doped with phosphorus or boron.

11. The device of claim 10, wherein
determining the enthalpy value comprises determining a core temperature value ($T_c$) of the Li-ion battery;
$T_c = \theta_{j-a} * P_c + T_a$;
$\theta_{j-a} = \theta_{c-s} + \theta_{s-f} + \theta_{f-a}$;
$\theta_{c-s}$ = thermal resistance of the Li-ion battery;
$\theta_{s-f}$ = thermal resistance of the device;
$\theta_{f-a}$ = thermal resistance of the heat sink;
$P_c$ = heat loss of the Li-ion battery due to one or more of a non-faradaic process and a faradic process; and
$T_a$ = temperature of the air adjacent to the heat sink.

12. A heat flux sensor device for measuring temperatures of a lithium-ion battery, comprising:
a flexible polymer substrate comprising a first side and a second side;
a transducer affixed to the first side;
a first thermally conductive pad ("TCP") thermally coupled to the transducer and affixed to the first side;
a second TCP thermally coupled to the transducer opposite to the first TCP and affixed to the first side;
a plurality of conductive traces electrically coupled to the transducer;
a third TCP affixed to the second side proximate to the second TCP;
a a fourth TCP affixed to the second side opposite to the third TCP and proximate to the first TCP;
wherein
the first TCP is thermally coupled to the fourth TCP via a first vertical interconnect access;
the second TCP is thermally coupled to the third TCP via a second vertical interconnect access;
the third TCP is configured to be thermally coupled to a Li-ion battery module;
the first TCP and the fourth TCP are both thermally isolated from the Li-ion battery and thermally coupled to a heat sink;
the first TCP, the third TCP, and the fourth TCP are configured to create a thermal gradient within the transducer;
the first TCP, the second TCP, the third TCP, and the fourth TCP comprise copper;
the transducer is configured to convert the thermal gradient to electrical output using the Seebeck effect;
the transducer is configured to transmit the electrical output via the plurality of conductive traces;
the device is configured to be positioned external to the Li-ion battery module;
the device comprises a planar state and a folded state;
the transducer comprises Si-dope material;
the first TCP and the fourth TCP are oriented
co-planarly with the second TCP and the third TCP when in the planar state; and
angularly with the second TCP and the third TCP when in the folded state.

13. The device of claim 12, wherein
the plurality of conductive traces is electrically coupled to a battery management system;
the battery management system is electrically coupled to the Li-ion battery; and
the battery management system configured to utilize the electrical output to at least partially power itself.

14. The device of claim 13, wherein the battery management system is configured to determine, using the electrical output, an entropy value of the Li-ion battery.

15. The device of claim 14, wherein the first TCP, the second TCP, the third TCP, and the fourth TCP are each substantially planar.

16. The device of claim 15, wherein the battery management system is configured to
determine an enthalpy value of the Li-ion battery,
determine a difference between the entropy value and the enthalpy value and thereby generate a calculated value;
determine a theoretical Gibbs tree-energy value change of the Li-ion battery;
generate a notification when the calculated value is greater than the theoretical Gibbs free-energy value change.

17. The device of claim 16, wherein the device comprises an overall thickness of up to 300 μm.

18. The device of claim 17, wherein the flexible polymer substrate comprises polyimide, polvetheretherketone, a polyester, polyethylene terephthalate, and Kapton.

19. The device of claim 18, wherein the battery management system comprises a wireless communications device.

20. The device of claim 19, wherein
determining the enthalpy value comprises determining a core temperature value ($T_c$) of the Li-ion battery;
$T_c = \theta_{j-a} * P_c + T_a$;
$\theta_{j-a} = \theta_{c-s} + \theta_{s-f} + \theta_{f-a}$;
$\theta_{c-s}$=thermal resistance of the Li-ion battery,
$\theta_{s-f}$=thermal resistance of the device;
$\theta_{f-a}$=thermal resistance of the heat sink;
$P_c$=heat loss of the Li-ion battery due to one or more of a non-faradaic process and a faradic process; and
$T_a$=temperature of the air adjacent to the heat sink.

* * * * *